United States Patent [19]
Kawai et al.

[11] Patent Number: 5,939,789
[45] Date of Patent: Aug. 17, 1999

[54] MULTILAYER SUBSTRATES METHODS FOR MANUFACTURING MULTILAYER SUBSTRATES AND ELECTRONIC DEVICES

[75] Inventors: Michifumi Kawai, Tokyo; Ryohei Satoh, Yokohama; Osamu Yamada, Hiratsuka; Eiji Matsuda, Yokohama; Masakazu Ishino, Yokohama; Takashi Inoue, Yokohama; Hideo Sotokawa, Yokohama; Masayuki Kyoui, Yokohama, all of Japan

[73] Assignee: Hitachi, Ltd., Tokyo, Japan

[21] Appl. No.: 08/893,323

[22] Filed: Jul. 16, 1997

Related U.S. Application Data

[63] Continuation of application No. 08/395,466, Feb. 28, 1995, abandoned.

[30] Foreign Application Priority Data

Feb. 28, 1994 [JP] Japan .................................... 6-030256

[51] Int. Cl.$^6$ ................................................. H01L 23/485
[52] U.S. Cl. .......................... 257/758; 257/759; 257/762; 257/741; 257/792; 257/774; 257/753
[58] Field of Search .................................... 257/758, 759, 257/762, 765, 792, 781, 773, 774, 753, 760; 439/68; 174/262

[56] References Cited

U.S. PATENT DOCUMENTS 5,309,629  5/1994  Traskos et al. ........................... 29/830
5,451,804  9/1995  Lur et al. ................................. 257/759

FOREIGN PATENT DOCUMENTS 0308051  12/1989  Japan ..................................... 257/758
0177864   6/1992  Japan ..................................... 257/758

OTHER PUBLICATIONS

Tummala et al., "Micro Electronics Packaging Handbook", Nikkei BP Co., Ltd., Mar. 1991, pp. 382, 554, 562 and 684.

Primary Examiner—David B. Hardy
Attorney, Agent, or Firm—Antonelli, Terry, Stout & Kraus, LLP

[57] ABSTRACT

A multilayer substrate which is fabricated by laminating a plurality of substrates, each comprising an insulation film, a plurality of via holes which pass through the upper surface to the lower surface of the insulation film, a wiring which is provided on the upper surface of the insulation film and the upper surface of the via holes and electrically connected with the via holes, a bonding member which is provided on the lower surfaces of the via holes and electrically connected with the via holes, and a bonding layer which is provided on the upper surface of the insulation film where the wiring is formed and the method of fabrication thereof whereby large costs reduction and high density effect can be obtained.

27 Claims, 11 Drawing Sheets

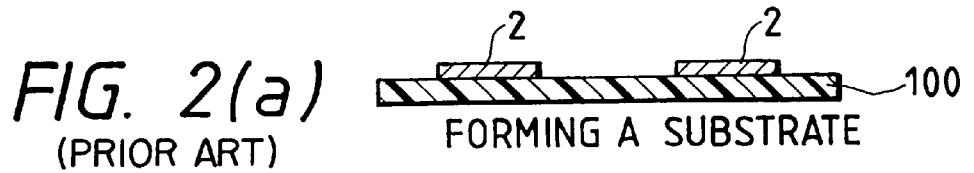
FIG. 2(a) (PRIOR ART) FORMING A SUBSTRATE
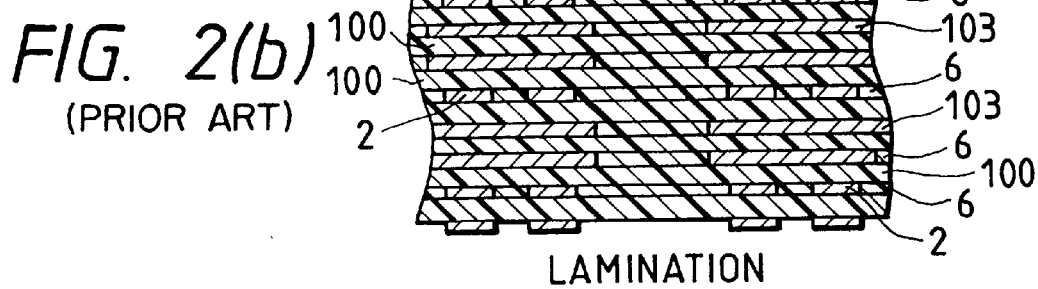
FIG. 2(b) (PRIOR ART) LAMINATION
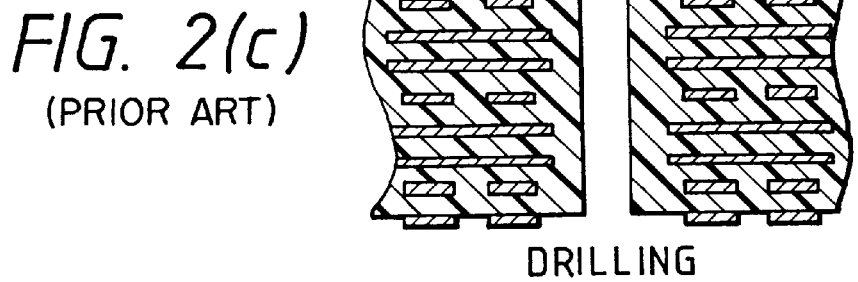
FIG. 2(c) (PRIOR ART) DRILLING
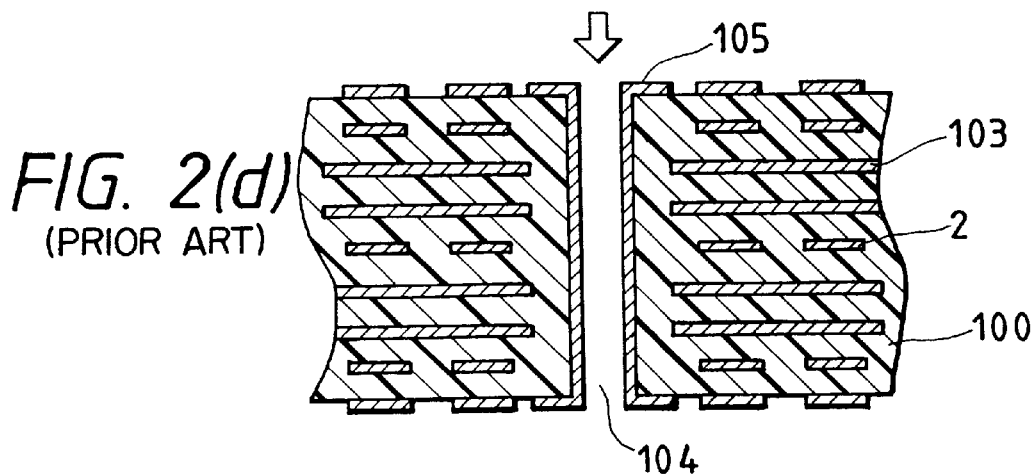
FIG. 2(d) (PRIOR ART)

PUNCHING

FORMING VIA HOLES

PRINTING A WIRING PATTERN

FORMING A BOTTOM SUBSTRATE

FORMING A SECOND SUBSTRATE

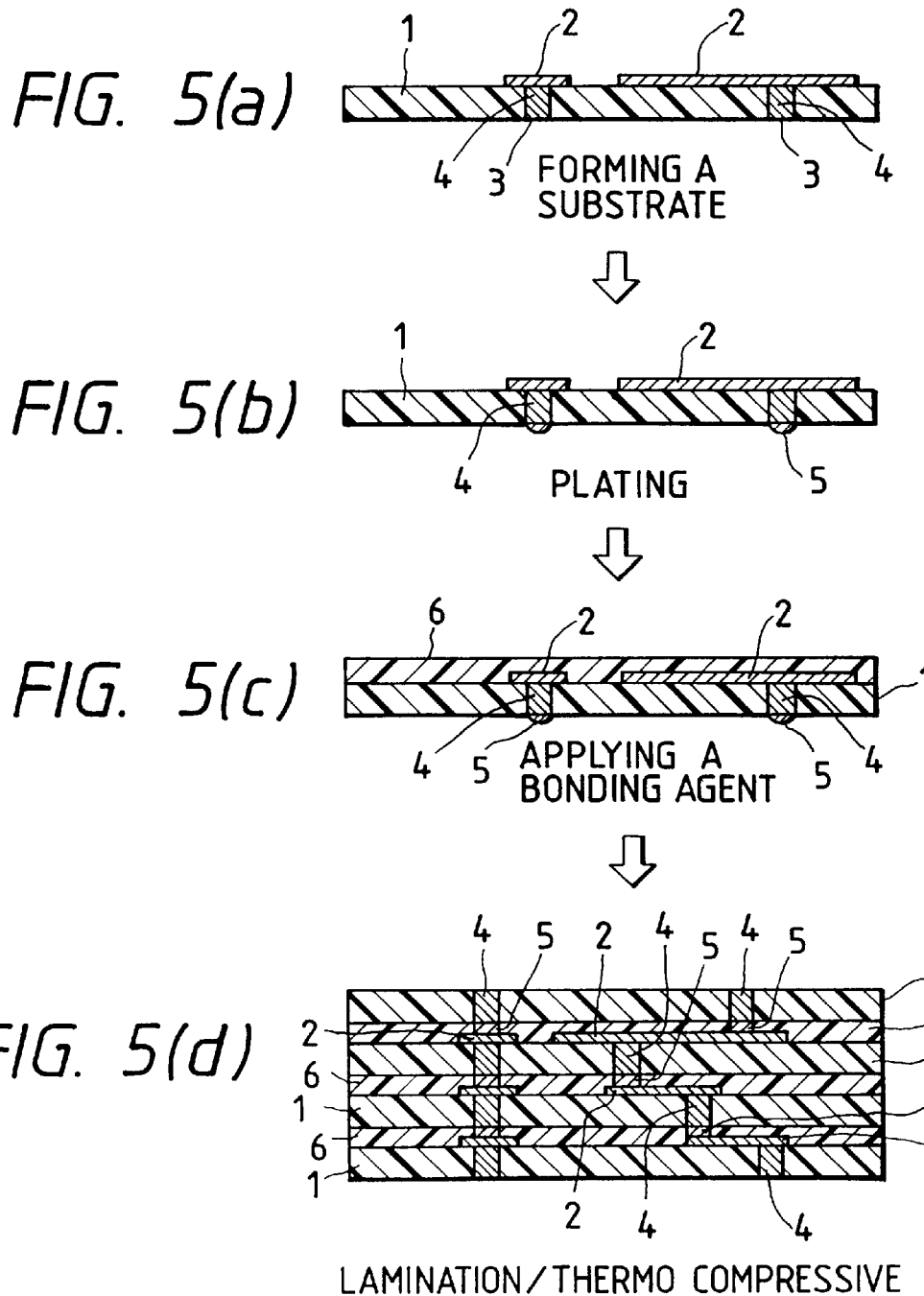

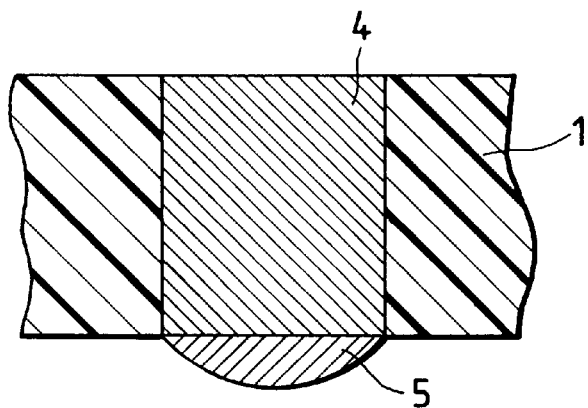
FIG. 9(a)
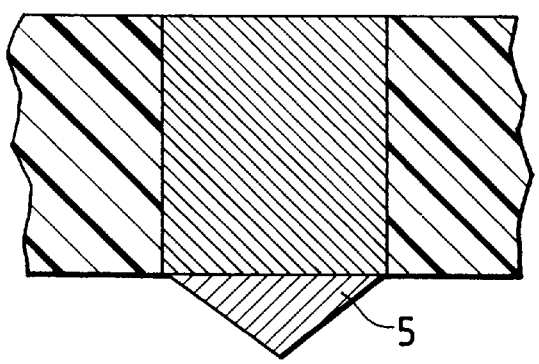
FIG. 9(b)
FIG. 10
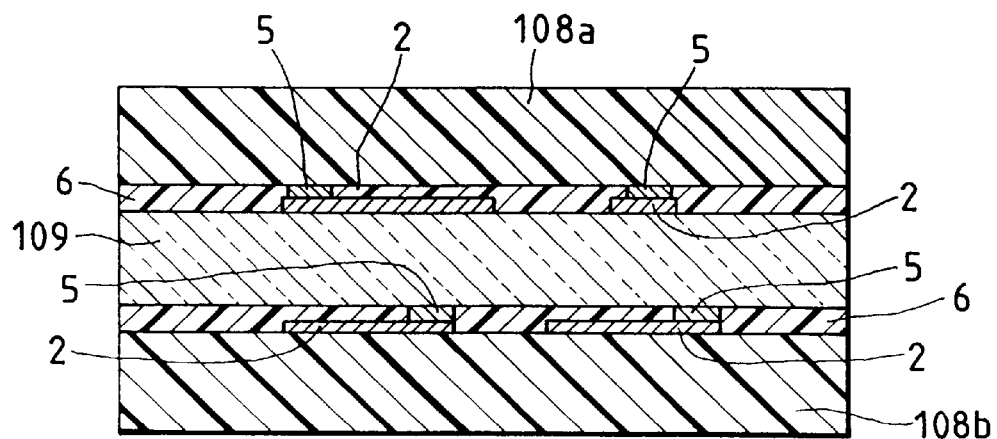

MULTILAYER SUBSTRATES METHODS FOR MANUFACTURING MULTILAYER SUBSTRATES AND ELECTRONIC DEVICES

This application is a continuation of application Ser. No. 08/395,466, filed on Feb. 28, 1995, now abandoned.

BACKGROUND OF THE INVENTION AND RELATED ART STATEMENT

The present invention relates to multilayer substrates, methods for manufacturing multilayer substrates and electronic devices.

Conventional art of multilayer substrates include (1) printed circuit boards (copper-lined multilayer substrates), (2) ceramic multilayer substrates, and (3) thin film sequential lamination substrates.

A fabrication process by the method for (1) is as described below. First, as shown in FIG. 2(a), a wiring 2 is printed on a film 100 of a substrate to form a wiring substrate. Next, as shown in FIG. 2(b), a plurality of wiring substrates are simultaneously stacked and bonded together with a copper film 103 and a through hole 104 is formed in the multilayer substrate as shown in FIG. 2(c) by drilling the multilayer substrate with a drill. Finally, as shown in FIG. 2(d), the through hole 104 is plated to permit electrical connection through a plating film 105. This state of art is described in Micro Electronics Packaging Handbook (Rao R. Tummala and J. Rymazewski, p 684, Nikkei BP Co., Ltd. (March 1991)).

A fabrication process by the method for (2) is as described below. First, as shown in FIG. 3(a), a hole 107 is formed in a sheet 101 obtained by molding a ceramic raw material called "green sheet" by using a punch and a via hole layer is formed as shown in FIG. 3(b) by forming a via hole 106 by plating. In addition, a wiring pattern 2 is printed at the specified position on the via hole layer as shown in FIG. 3(c). Finally, a plurality of via hole layers having the wiring pattern which is thus formed as described above are registered, stacked and sintered as shown in FIG. 3(d). This state of art is described in Micro Electronics Packaging Handbook (Rao R. Tummala and J. Rymazewski, p 382, Nikkei BP Co., Ltd. (March 1991)).

A fabrication process by the method for (3) is as described below. First, as shown in FIG. 4(a), a resin 109 is applied onto a ceramic multilayer substrate 102 and a first thin film wiring substrate having a wiring 110 is formed on a layer of this resin 109 through thin film wiring substrate processes such as for forming a resist, a resist for exposure, cleaning and plating, a through hole, and a wiring pattern. In addition, a multilayer substrate having a multilayer thin film wiring can be fabricated on the ceramic multilayer substrate 102 by laminating a plurality of wiring substrates on the first thin film wiring substrate by repeating the above-described thin film wiring substrate forming processes. This state of art is described in Micro Electronics Packaging Handbook (Rao R. Tummala and J. Rymazewski, p 554 and p562, Nikkei BP Co., Ltd. (March 1991)).

OBJECT AND SUMMARY OF THE INVENTION

The art of (1) is disadvantageous in that a wiring density cannot be improved due to limitation to mechanical perforation by using a drill and such mechanical perforation may require higher costs than other techniques as the number of layers increases. The art of (2) is also disadvantageous in that, though the number of processes does not so increase and costs are relatively low for formation by simultaneous sintering even though the number of layers is increased, an increase in the mounting density cannot be easily facilitated and is limited due to limitation to perforation by means of punching.

Therefore for implementation of fine wiring, though it is preferable to form a multilayer thin film substrate and fine wiring is generally more easily enabled by the art of (3) than the art of (1), the number of processes involved in the former increases and the corresponding costs therefor substantially increase. In other words, the art of (3) enables fine wiring and requires a less number of layers than the art of (2) but requires a larger number of processes and higher costs since the layers are formed by laminating one by one.

Therefore, an object of the present invention is to simultaneously solve two problems for (1) large cost reduction by simultaneous lamination of multilayer substrates and (2) high precision, fine and high density wiring and develop a high density multilayer substrate with less costs.

This object can be accomplished for the multilayer substrates by (A) or (B) described below.

(A) A multilayer substrate which is formed by laminating a plurality of wiring substrates each of which comprises an insulation film, a plurality of via holes which pass through from an upper surface to a lower surface of the insulation film, a wiring which is provided on the upper surface of the insulation film and the upper surfaces of the via holes and electrically connected with the via holes, a bonding member which is provided on the lower surfaces of the via holes and electrically connected with the via holes, and a bonding layer which is provided on the upper surface of the insulation film where the wiring is formed.

(B) A multilayer substrate which is formed by laminating a plurality of wiring substrates each of which comprises an insulation film, a plurality of via holes which pass through from an upper surface to a lower surface of the insulation film, a wiring which is provided on the upper surface of the insulation film and the upper surfaces of the via holes and electrically connected with the via holes, a frame pattern which is provided on an external periphery of the upper surface of the insulation film, a first bonding member which is provided on the lower surfaces of the via holes and electrically connected with the via holes, and a second bonding member which is provided on an external periphery of the lower surface of the insulation film so that the second bonding member is located to be approximately symmetrical to the frame pattern with the insulation film interposed therebetween.

The multilayer substrate can be formed by (C) or (D) described below.

(C) A method for manufacturing a multilayer substrate, comprising:
   (a) a through hole forming step for forming a plurality of through holes which pass through from an upper surface to a lower surface of an insulation film,
   (b) a via hole forming step for forming a plurality of via holes by filling the through holes with conductors,
   (c) a wiring forming step for forming a wiring on an upper surface of the insulation film and upper surfaces of the via holes,
   (d) a bonding member forming step for forming a bonding member on lower surfaces of the via holes,
   (e) a bonding layer forming method for applying a bonding agent to the upper surface of the insulation film where the wiring is formed,
   (f) a substrate laminating step for stacking a plurality of substrates manufactured in steps (a) to (e), and (g) a thermo-compression step for thermo-compressing a plurality of substrates which are stacked as described above.

(D) A method for manufacturing a multilayer substrate, comprising:

(a) a through hole forming step for forming a plurality of through holes which pass through from an upper surface to a lower surface of an insulation film, (b) a via hole forming step for forming a plurality of via holes by filling the through holes with conductors, (c) a wiring forming step for forming a wiring on an upper surface of the insulation film and upper surfaces of the via holes, (d) a bonding member forming step for forming a bonding member on lower surfaces of the via holes, (e) a substrate laminating step for stacking a plurality of substrates manufactured in steps (a) to (e), and (f) a thermo-compression step for thermocompressing a plurality of substrates which are stacked as described above.

An electronic device can be formed as described in (E) below.

(E) An electronic device comprising an LSI, a multilayer substrate, a power supply part and an external storage part, characterized in that the multilayer substrate comprises a plurality of substrates each of which comprises an insulation film, a plurality of via holes which pass through from an upper surface to a lower surface of the insulation film, a wiring which is provided on the upper surface of the insulation film and the upper surfaces of the via holes and electrically connected with the via holes, a bonding member which is provided on the lower surfaces of the via holes and electrically connected with the via holes, and a bonding layer provided on the surface of the insulation film where the wiring is formed.

BRIEF DESCRIPTION OF THE DRAWINGS

FIG. 2(a) is an enlarged view of part 108 in FIG. 1(a);

FIGS. 2(a)–2(d) illustrate a fabrication method for a printed circuit board according to the prior art;

FIGS. 5(a)–(d) illustrate a fabrication method for multilayer substrate such as embodiment 1 according to the present invention;

FIGS. 9(a) and 9(b) are cross sectional views showing a shape of a bonding member according to embodiments 1 and 4, respectively;

FIG. 10 is a cross sectional view of the multilayer substrates obtained by further laminating the stacked substrates in an embodiment 5;

DETAILED DESCRIPTION OF THE PREFERRED EMBODIMENTS

Figure 1A:
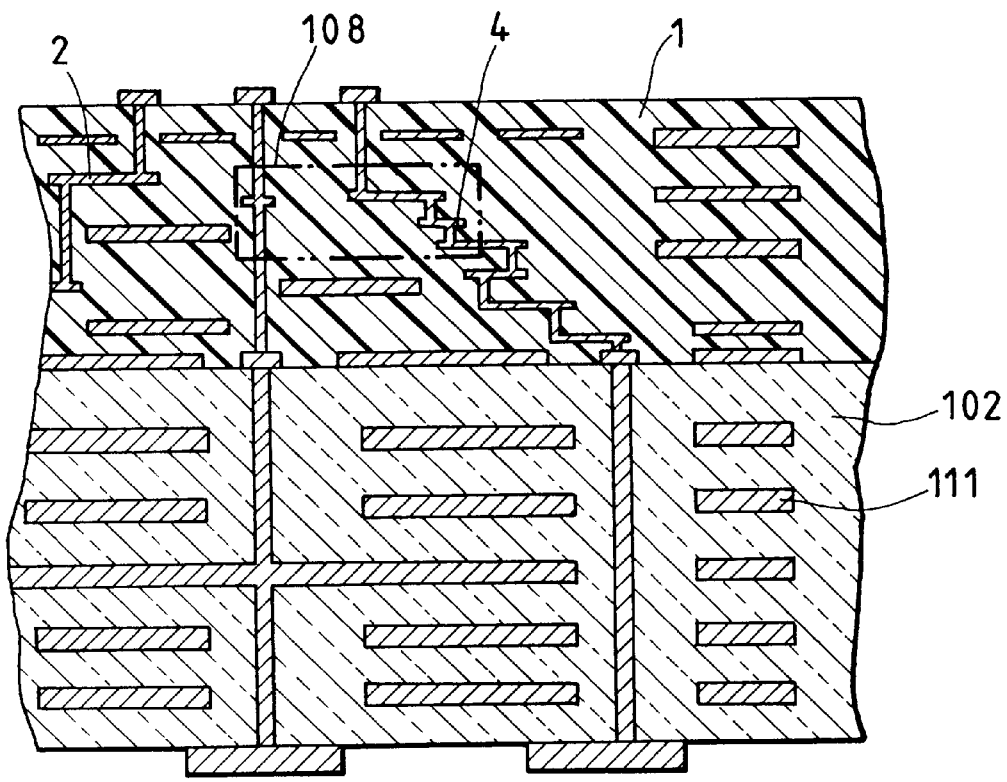
FIG. 1(a) and 1(b) are a cross sectional view of a multilayer substrate formed according to an embodiment 1.

The present inventor et al. have achieved, as a result of the investigative efforts, a high density multilayer substrate with less costs. That is, applicants' invention solves the aforementioned difficulties of conventional schemes through implementing a multilayer substrate scheme in which; (1) large cost reduction by simultaneous lamination of the multilayer substrates and (2) high precision, fine, high density wiring are achieved.

Consequently, the present inventor et al. have obtained a finding that the object can be achieved with a configuration described in the following (A) to (E).

(A) and (B) described below relate to the multilayer substrate.

(A) A multilayer substrate which is formed by laminating a plurality of wiring substrates each of which comprises an insulation film, a plurality of via holes which pass through from an upper surface to a lower surface of the insulation film, a wiring which is provided on the upper surface of the insulation film and the upper surfaces of the via holes and electrically connected with the via holes, a bonding member which is provided on the lower surfaces of the via holes and electrically connected with the via holes, and a bonding layer which is provided on the upper surface of the insulation film where the wiring is formed.

(B) A multilayer substrate which is formed by laminating a plurality of wiring substrates each of which comprises an insulation film, a plurality of via holes which pass through from an upper surface to a lower surface of the insulation film, a wiring which is provided on the upper surface of the insulation film and the upper surfaces of the via holes and electrically connected with the via holes, a frame pattern which is provided on an external periphery of the upper surface of the insulation film, a first bonding member which is provided on the lower surfaces of the via holes and electrically connected with the via holes, and a second bonding member which is provided on an external periphery of the lower surface of the insulation film so that the second bonding member is located to be approximately symmetrical to the frame pattern with the insulation film interposed therebetween.

(C) or (D) described below relate to the fabrication method for the multilayer substrate.

(C) A method for manufacturing a multilayer substrate, comprising:

(a) a through hole forming step for forming a plurality of through holes which pass through from an upper surface to a lower surface of an insulation film, (b) a via hole forming step for forming a plurality of via holes by filling the through holes with conductors, (c) a wiring forming step for forming a wiring on an upper surface of the insulation film and upper surfaces of the via holes, (d) a bonding member forming step for forming a bonding member on lower surfaces of the via holes, (e) a bonding layer forming method for applying a bonding agent to the upper surface of the insulation film where the wiring is formed, (f) a substrate laminating step for stacking a plurality of substrates manufactured in steps (a) to (e), and (g) a thermo-compression step for thermo-compressing a plurality of substrates which are stacked as described above.

(D) A method for manufacturing a multilayer substrate, comprising;

(a) a through hole forming step for forming a plurality of through holes which pass through from an upper surface to a lower surface of an insulation film, (b) a via hole forming step for forming a plurality of via holes by filling the through holes with conductors, (c) a wiring forming step for forming a wiring on an upper surface of the insulation film and upper surfaces of the via holes, (d) a bonding member forming step for forming a bonding member on lower surfaces of the via holes, (e) a substrate laminating step for stacking a plurality of substrates manufactured in steps (a) to (e), and (f) a thermo-compression step for thermo-compressing a plurality of substrates which are stacked as described above.

(E) described below relates to the electronic device.

(E) An electronic device comprising an LSI, a multilayer substrate, a power supply part and an external storage part, characterized in that the multilayer substrate comprises a plurality of substrates each of which comprises an insulation film, a plurality of via holes which pass through from an upper surface to a lower surface of the insulation film, a wiring which is provided on the upper surface of the insulation film and the upper surfaces of the via holes and electrically connected with the via holes, a bonding member which is provided on the lower surfaces of the via holes and electrically provided with the via holes, and a bonding layer provided on the surface of the insulation film where the wiring is formed.

(A) to (E) are described below in detail.

Any type of member can be selected for the insulation film described in (A) to (E) as far as it has an insulating property. For example, a polyimide-based insulation film, a ceramic-based insulation film, an epoxy-based insulation film and a glass-based insulation film are available. A sheet type insulation film can also be used.

For the wiring described in (A) to (E), Cu, Al, W, Au, Pt, Ag, and Ag—Pd alloy can be used.

A melting point of the bonding member described in (A) to (E) is lower than both a melting point of the wiring and a heat resisting temperature of the insulation film, and the melting point of a metal compound formed with a wiring metal after bonding is effected rises above the melting point of the bonding member itself and, therefore, for the bonding member an ideal material is satisfactory which has the melting point exceeding the heat resisting temperature of the insulation film. The heat resisting temperature of the insulation film is a temperature at which the structures of molecules in the insulation film begin to change and the required electrical insulating property begins to suddenly deteriorate. Combinations of the bonding member and the wiring are preferably Sn/Cu, Sn—Pb/Cu, Pb/Cu, Au/Cu, Ag/Cu, Zn/Cu, In/Cu, Sn/Al, Au/Al, Ag/Al, Sn—Ag/Al, brazing material/Cu and brazing material/Al.

Though the types of materials for the bonding layers described in (A) to (E) are not limited if they can be bonded, for example, a hardened thermoplastic bonding agent and a hardened thermo-setting bonding agent can be used. The bonding layer can be provided on the whole surface of the insulation film or on part of the insulation film so that the bonding layer can be formed as a frame on the external periphery. In a case in which the bonding layer is provided in the shape of a frame, it is preferable that the frame is filled with one of a dry gas and a resin or the pressure in the frame is kept reduced. These states of the frame are satisfactory if the states are adapted so that oxidation and migration of the bonding member and the wiring can be prevented. The types of the above-described dry gases include dry air, dry nitrogen and inert gas.

A bonding member formed in the step (d) of (C) and the step (d) of (D) described above is satisfactory if it is shaped to push away the bonding agent to certainly ensure the bonding surface with the wiring when the bonding agent is applied, and is satisfactory if it is shaped to increase a pressure to be applied to the bonding part in thermo-compression to facilitate forming of an alloy layer when the bonding agent is not applied. Particularly, the shape is preferably conical and the conical bottom surface is preferably connected to the lower surfaces of the via holes.

Though the step (f) of (C) and the step (e) of (D) described above are satisfactory if these steps are adapted to facilitate positioning of a specified connection point of the bonding member and the wiring, it is preferable that the steps permit to stack the substrates mounted in advance one by one on the external frame for fixing substrates which is a frame mold. It is preferable that the external frame for fixing the substrates to be used is larger in the order of laminating the substrates. Since adjacent substrates are free from necessity of selection of substrate material, a plurality of substrates having insulation films whose basic material is a ceramics and substrates having insulation films whose basic material is a resin can be stacked.

It is preferable that the step (g) of (C) and the step (f) of (D) described above include a bonding step for positive diffusion bonding of the bonding member and the wiring under a state where the fluidity of the bonding agent is large by first heating, after compressing a plurality of laminated substrates, and a bonding step for hardening the bonding agent of the bonding layer by second heating. In addition, it is preferable that the temperature in the second heating is higher than that in the first heating. It is preferable that these steps are carried out in an atmosphere of nitrogen gas or inert gas, or an atmosphere where the pressure is reduced.

Preferred embodiments of the present invention are described in detail referring to the accompanying drawings.

Main reference numerals used in the drawings and the contents thereof are shown below.

1 . . . Insulation film, 2 . . . Wiring, 3 . . . Via hole end part, 4 . . . Via hole, 5 . . . Bonding member, 6 . . . Bonding agent, bonding layer, 7 . . . Alloy layer, 8 . . . Inter-layer clearance, 9 . . . Frame type pattern, 10 . . . Frame type bonding member, 11, 11a, 11b . . . External frame for fixing substrates, 70, 70a, 70b, 70c . . . Sheet, 71, 72 . . . Picture frame type member, 73 . . . Sheet holding clearance, 100 . . . Printed circuit board, 101 . . . Green sheet, 102 . . . Ceramic multilayer substrate, 103 . . . Metal foil, 104 . . . Through hole, 105 . . . Plated film, 106 . . . Via hole, 107 . . . Punched hole, 108a, b . . . Polyimide thin film lamination substrates, 109 . . . Ceramic lamination substrates, 200 . . . Chamber, 201, 203 . . . Heater, 202 . . . Heating plate, 204a, b, c . . . Temperature sensor, 205 . . . Measuring unit, 206 . . . Control unit, 207 . . . Power supply circuit, 208 . . . Inert gas cylinder (Embodiment 1)

Figure 1B:
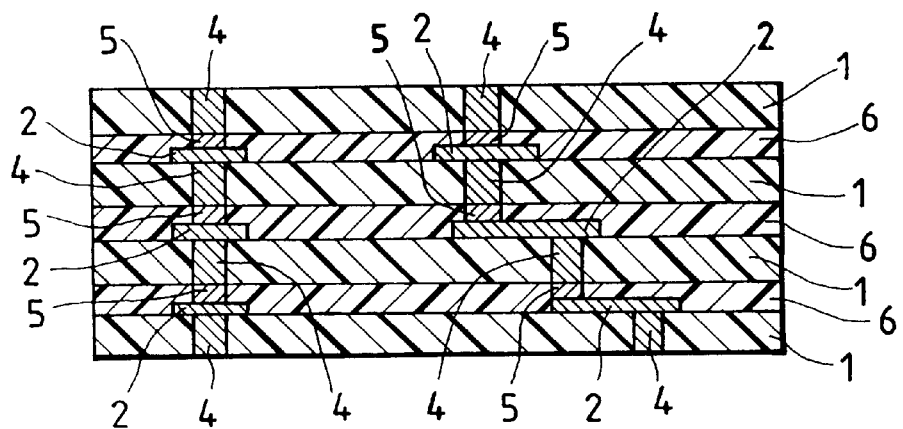
Figure 3A:
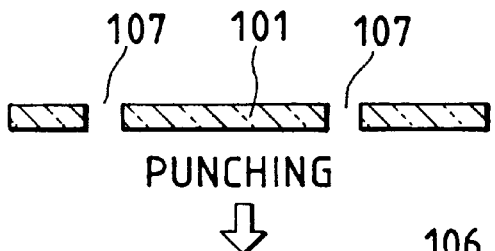
FIGS. 3(a)–3(d) illustrate a fabrication method for a ceramic multilayer substrate according to the prior art.
Figure 3B:
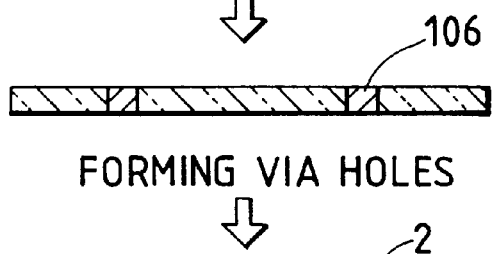
Figure 3C:
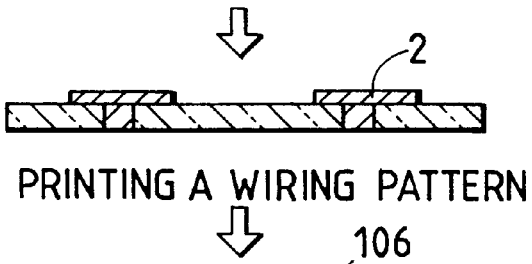
Figure 3D:
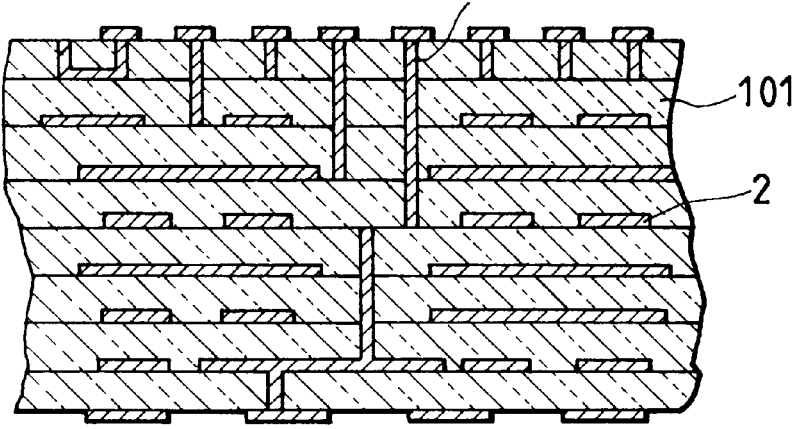
Figure 4A:
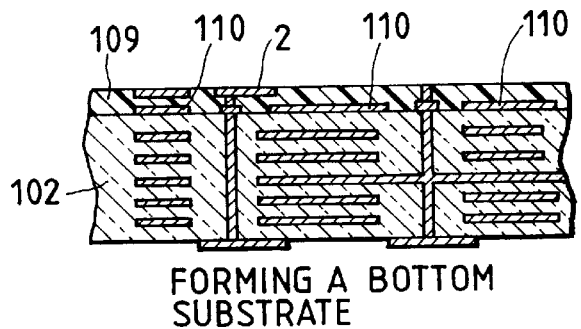
FIGS. 4(a)–4(c) illustrate a fabrication method for thin film sequentially stacked substrates according to the prior art.
Figure 4B:
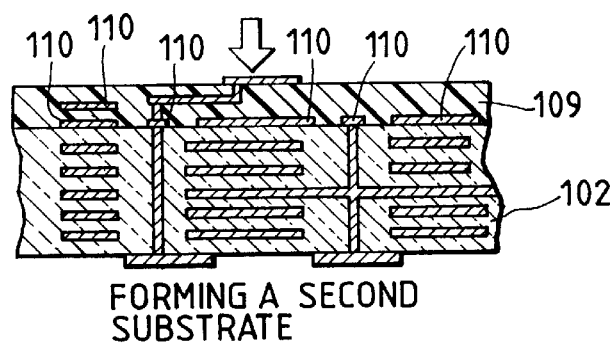
Figure 4C:
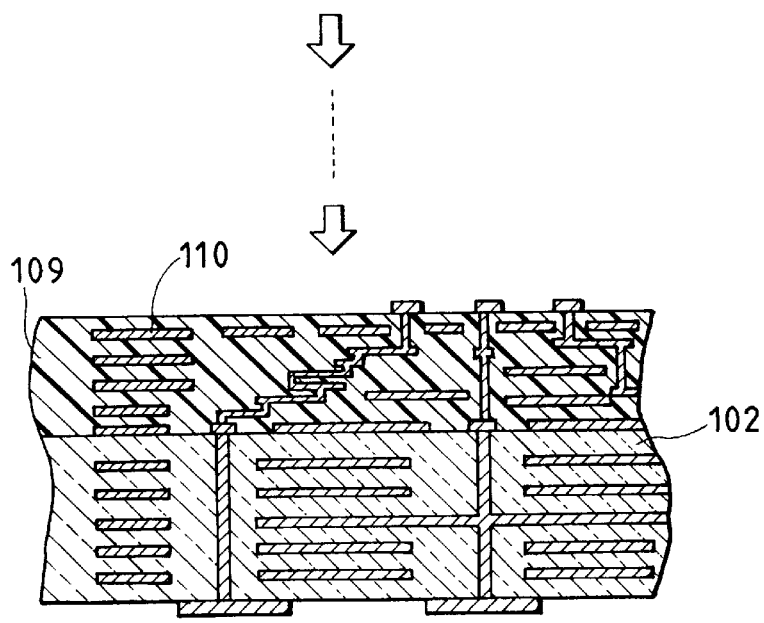
Figure 6:
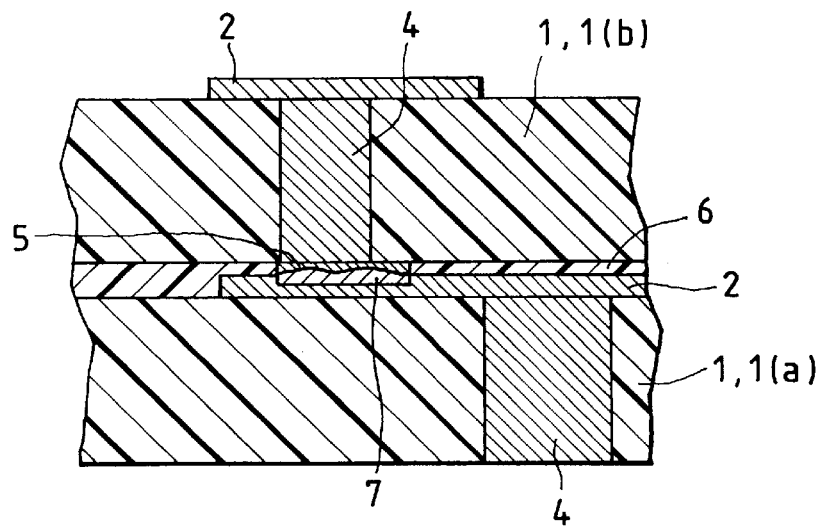
FIG. 6 is an enlarged cross sectional view of an inter-layer bonding part in the multilayer substrate according to the present invention.

A cross sectional view of a multilayer substrate fabricated according to this embodiment is shown in FIG. 1(a). The multilayer substrate fabricated according to this embodiment is made up by stacking a ceramic multilayer substrate 102 provided with a wiring 111 and a multilayer thin film substrate. An enlarged view of part 108 of the section of this multilayer thin film substrate is shown in FIG. 1(b). The thin film portion is formed with a plurality of insulation films (sheets) 1 and bonding agent layers 6 which are alternately laminated and a wiring pattern 2 on the surfaces of the insulation films 1 and the via holes 4 provided in the insulation films 1 are connected with bonding members 5 made of a metal or an alloy.

In this embodiment, the insulation film 1 is made of polyimide and is shaped in a right square of 200 mm in each side dimension with a thickness of 50 μm to 1 mm. The wiring pattern 2 in this embodiment is made of copper and has a width of 20 to 70 μm. The via holes 4 are filled with the same metal as for the wiring pattern 2. The bonding member 5 of this embodiment is made of Sn and mounted so that the end of the via hole is covered by plating. The bonding member may be attached by depositing or the other method.

In this embodiment, a polyimide-based bonding agent 6 is used for bonding substrates. A polyimide-based thermoplastic bonding agent or an epoxy-based or silicon-based thermosetting bonding agent can be used as a bonding agent. It is preferable that the bonding agent 6 has a fluidity at a lower temperature than that at which diffusion bonding of the bonding member 5 and the wiring 2 takes place and is hardened at a temperature higher than such temperature. The bonding agent is quickly moved so that it does not remain in a clearance between the bonding member 5 and the wiring 2 when the bonding member 5 and the wiring 2 are made contact each other and the contact of the bonding member 5 and the wiring 2 is not impaired. Further it is preferable to use the bonding agent which does not react with a metal of the bonding member 5 and the wiring 2. If a bonding agent which tends to be compounded with such metals is used, a compound film is formed on the surface of the metal and a fixed diffusion takes place on the surface of that metal and the surface of the metal can no longer be as clean as required and satisfactory bonding may not be obtained.

Fabrication processes for multilayer substrates according to this embodiment are described referring to FIG. 5.

(1) A sheet made of polyimide is provided with through holes by using an excimer laser and via holes 4 are formed by filling the through holes with copper. After this, a wiring pattern 2 is formed with copper on the upper surface of the sheet 1. With the above, an insulation film 1 provided with the wiring 2 and via holes 4 as shown in FIG. 5(a) can be formed.

(2) An Sn film is formed by plating on a portion 3 of the lower surface of the polyimide sheet where the metal which fills the via holes 4 is exposed. Thus the insulation film 1 provided with a bonding member 5 as shown in FIG. 5(b) can be formed. The bonding member 5 in this embodiment is of a pad type with a diameter of the bottom of 10 to 300 μm and the thickness of 1 to 30 μm.

(3) A polyimide-based bonding agent 6 is applied onto the surface having the wiring 2 of the insulation film 1 provided with the bonding member 5 to form the insulation film 1 provided with a bonding agent layer 6 as shown in FIG. 5(c).

(4) All twenty insulation films 1 each being provided with a bonding agent layer 6 are laminated by aligning the positions of the insulation films. After the bonding member 5 and the wiring 2 are made contact by applying a pressure to the laminated member obtained as described, the whole laminated member is thermo-compressed by heating it to 350° C. Thus a multilayer substrate as shown in FIG. 5(d) can be obtained. In this embodiment, the positions of the insulation films are aligned by an optical method by using 3 to 4 reference points. Alignment of the positions can be carried out by mechanically providing the through holes at four corners of the external periphery of each film and inserting rods into these through holes.

FIG. 5(d) shows the thin film sheets which are laminated. In this embodiment, for laminating 20 thin film sheets 1 in (4) by applying the bonding agent 6 to the surface having the wiring (connection terminals) of the ceramic multilayer substrate 102, this ceramic multilayer substrate 102 is laminated as the lowest layer and the thin films are thermo-compressed together with the ceramic substrate. Thus, in this embodiment, the thin film substrates and the ceramic substrate are simultaneously bonded with bonding of thin film sheets. In this embodiment, the bonding member 5 is formed in (2) on the lowest of the insulation films 1 for connection with the wiring on the upper surface of the ceramic multilayer substrate. However, in the case that the via holes 4 of the lowest insulation film 1 need not be connected with the wiring of other substrates by thermo-compression, the bonding member 5 described in (2) need not be formed on this lowest insulation film.

When the clean surfaces of the wiring pattern metal 2 and the bonding member 5 come in contact each other by a pressure applied in thermo-compression in (4), diffusion of metal atoms begin. Diffusion of metal atoms is promoted by heating whereby both metals form an alloy at a certain specified concentration ratio (Sn:Cu =6:5 in a combination according to this embodiment) and simultaneously the bonding agent 6 is hardened by heating. In this embodiment, inter-layer bonding is carried out by formation of this alloy layer and hardening of the bonding agent.

The multilayer substrate fabricated according to this embodiment enables high precision, high density wiring and satisfactory electrical conduction between substrates.

In this embodiment, formation of the alloy layer and hardening of the bonding agent are simultaneously carried out and, if the bonding agent which is hardened at a higher temperature is used, the alloy layer is first formed and the bonding agent is hardened by further heating.

If a brazing material of Sn-Au and copper are used as the bonding member 5 and the wiring 2 even in a case that the bonding member 5 is made of a metal of a low melting point, and an alloy forming temperature and a hardening temperature of the bonding agent are higher than the melting point of the metal, the melting point of the alloy is higher when the alloy layer is formed and therefore the bonding part can be solidified at the holding temperature (for forming the alloy or hardening the bonding agent) higher than the melting point of the metal and a satisfactory connecting part can be obtained.

(Embodiment 2)

Figure 7A:
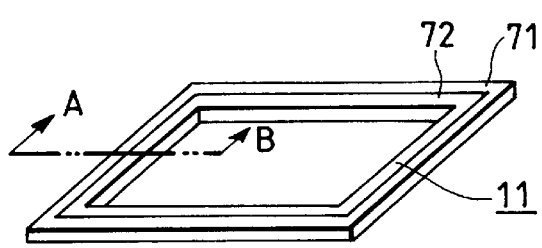
FIGS. 7(a)–(e) are illustrations showing an external frame for fixing the layers according to embodiment 2.
Figure 7B:
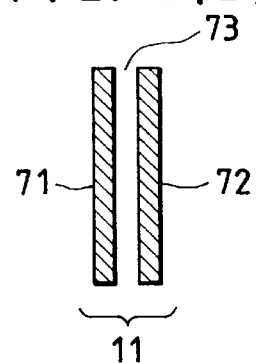

In this embodiment 2, the sheets are laminated while maintaining their flatness and therefore the sheets are laminated while the sheets are extended over the external frame for fixing the substrates. An external perspective view of the external frame 11 for fixing the substrates to be used in this embodiment is shown in FIG. 7(a). The sectional view between A and B in FIG. 7(a) is shown in FIG. 7(b). The substrate fixing external frame 11 in this embodiment consists of two large and small frame type members 71 and 72 so that, when the frame type member 72 (smaller member)

is fitted inside the other frame type member 71 (larger member), the internal side of the frame type member 71 (larger member) and the frame type member 72 (smaller member) are opposed each other with a clearance 73 therebetween. In this embodiment, the sheets are fixed to maintain their flatness by holding the edges of sheets in the clearance 73 between the frame type members 71 and 72.

Figure 7C:
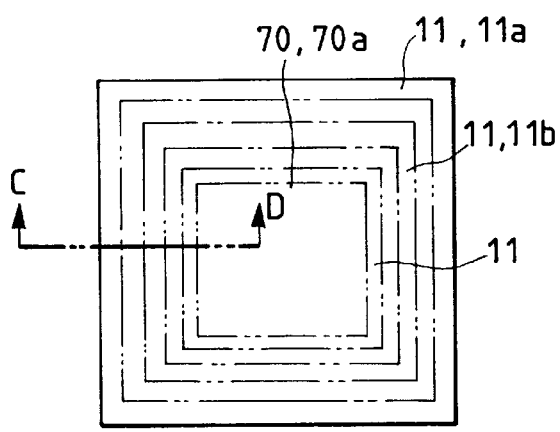
Figure 7D:
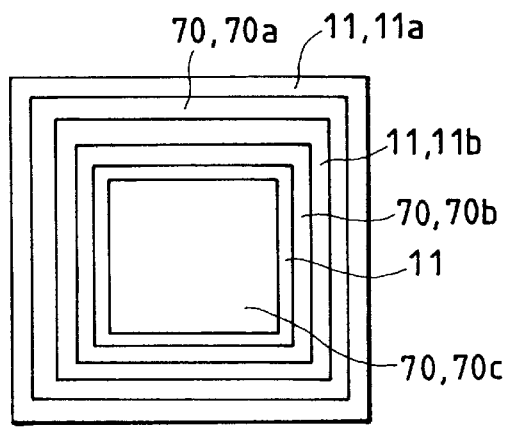
Figure 7E:
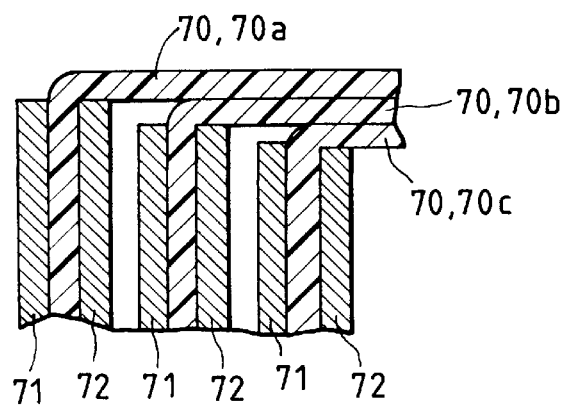

A schematic top view of the laminated sheets is shown in FIG. 7(c) and the bottom schematic view is shown in FIG. 7(d), respectively. A sectional view of a part between C and D in FIG. 7(c) is shown in FIG. 7(e). FIGS. 7(c), (d) and (e) respectively show three sheets 70 which are laminated. However, the present invention is not limited to this method of lamination and a larger number of sheets 70 can be laminated by preparing more substrate fixing external frame. In FIGS. 7(c), (d) and (e) respectively show three sheets as 70a, 70b and 70c in this order from the above.

On the sheets 70 to be laminated in this embodiment, the wiring, via holes, bonding members and bonding agent layers are already formed. For laminating the sheets 70, those sheets 70 to be laminated above are fixed inside the substrate fixing external frame 11 as large as able to accommodate the substrate fixing external frame 11 into which the substrate fixing external frame 11 on which the sheets 70 to be laminated below are fixed. Thus, the sheets at higher positions are fixed to the larger substrate fixing external frames 11. The flatness of each sheet 70 can be maintained by laminating the higher position sheet together with the substrate fixing external frame 11 to cover the lower position sheet 70 together with the substrate fixing external frame 11.

In this embodiment 2, a multilayer thin film substrate is obtained by separating sheets 70, which have been laminated as described above, from the substrate fixing external frame after thermo-compression as in the embodiment 1. A high precision, fine, high density wiring is materialized and electrical conduction between substrates is satisfactory on the multilayer thin film substrate formed according to this embodiment 2.

(Embodiment 3)

Figure 8A:
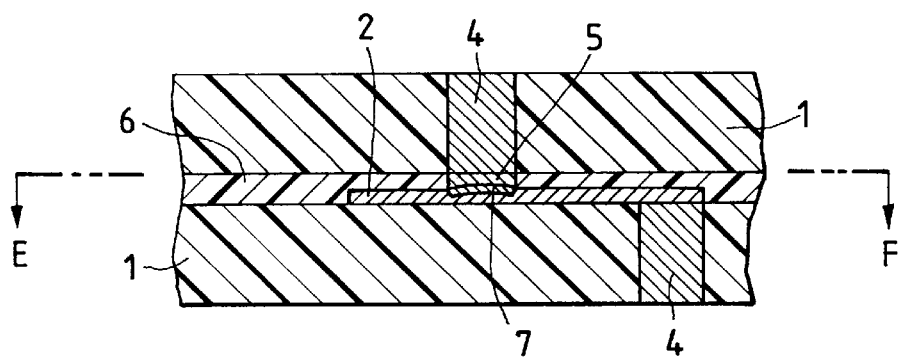
FIGS. 8(a) and 8(b) are schematic diagrams showing a shape of a wiring pattern to be connected to a bonding member according to embodiment 3.
Figure 8B:
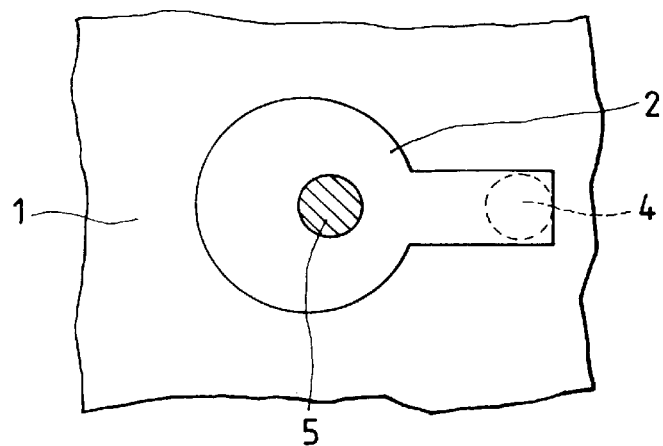

In this embodiment 3, the bonding member is expanded in a pad type so as to obtain a satisfactory connection even though shrinkage of sheets varies. A sectional view of a bonded part with the bonding member is shown in FIG. 8(a). A sectional view of a part between E and F in FIG. 8(a) is shown in FIG. 8(b). In FIG. 8(b), however, the bonding agent layer 6 is ignored to make it easy to observe the diagram. In this embodiment, the upper connection part with the via holes 4 of the wiring substrate 2 is expanded to be larger than the bonding member 5 as shown in FIGS. 8(a) and (b). Thus satisfactory connection is ensured even though the position of the bonding member deviates from the specified position due to variations of the shrinkage of the sheets and a positioning error.

In this embodiment 3, after the wiring 2 which has such wide bonding part has been formed on the thin insulation film provided with the via holes 4, the bonding member 5 is formed on the bottoms of the via holes 4 as in the embodiment 1, the bonding agent layer 6 is formed by applying the bonding agent, and a multilayer thin film substrate is obtained by lamination and thermo-compression. On the multilayer substrate fabricated according to this embodiment 3, high precision, fine and high density wiring is materialized and electrical conduction between layers is satisfactory.

(Embodiment 4)

In this embodiment 4, the bonding member 5 is formed in the shape of bump to prevent the bonding agent 6 from remaining between the metal 5 and the wiring pattern 2 in thermo-compression. The shape of the bonding member 5 in the embodiment 1 is smoothly convexed as shown in FIG. 9(a). On the contrary, the bonding member 5 in this embodiment is formed in a shape of cone with a bottom diameter of 10 to 300 μm (a part connected to the via holes 4) and a height of 1 to 30 μm as the sectional view is shown in FIG. 9(b). It can be adapted so that, when the bonding member 5 is depressed against the wiring 2 of the lower sheet, the bonding agent 6 applied to the upper side of the bonding member 5 quickly moves and does not remain on the contact surfaces of the bonding member 5 and the wiring 2 by forming the tip of the bonding member 5, which is depressed against the wiring 2, in a relatively sharpened shape.

In this embodiment 4, the multilayer substrate is fabricated in the same manner as in the embodiment 1 except for the shape of the bonding member 5. On the multilayer substrate fabricated according to this embodiment 4, high precision, fine and high density wiring is materialized and electrical conduction between layers is satisfactory.

(Embodiment 5)

In the embodiment 5, laminates which are formed by simultaneously laminating in advance several substrates are connected using the bonding agent layer 6. The multilayer substrate obtained according to this embodiment 5 has a construction that a ceramic laminate 109 is held between two polyimide thin film laminates 108a and 108b as shown in FIG. 10. To avoid complexity of the diagram, the wiring 2, via holes 4, the bonding agent layer 6 and the bonding member 5 which are provided inside the laminates 108a, 108b and 109 are omitted in FIG. 10.

In this embodiment 5, two polyimide thin film laminates 108a and 108b which have been obtained by laminating 20 layers of polyimide sheets and a ceramic laminate 109 which has been obtained by laminating 20 layers of green sheets are prepared. The end parts of via holes are exposed on the bottoms of the first polyimide thin film laminate 108a (to be laminated as the top layer) and the ceramic laminate 109, and the wiring 2 is provided on the upper surfaces of the second polyimide thin film laminate 108b (to be laminated as the bottom layer) and the ceramic laminate 109.

Subsequently, the bonding agent layer 6 is formed by attaching the bonding member 5 to the end parts of the via holes which are exposed on the bottoms of the first polyimide thin film laminate 108a and the ceramic laminate 109 and applying the bonding agent to the upper surfaces (where the wiring 2 is provided) of the ceramic laminate 109 and the second polyimide thin film laminate 108b.

The ceramic laminate 109 is mounted on the first polyimide thin film laminate 108b, the first polyimide laminate 108a is further mounted thereupon, and the bonding member 5 and the wiring are made contacted by applying a pressure from above and below. Finally, an alloy layer is formed by gradually raising the temperature up to approximately 350° C. while applying the pressure and a multilayer substrate which is made up by further laminating three laminates by hardening the bonding agent 6 is obtained.

The multilayer substrate fabricated according to this embodiment 5 enables to implement high precision, fine and high density wiring and provide satisfactory electrical conduction between layers. Though the laminates obtained by laminating in advance 20 layers of sheets are connected, the number of laminates is not limited to the number described above and those laminates which are formed by laminating a desired number of sheets can be used. The number of laminates and combination of types of laminates can be determined as desired. For example, elements in such combinations as polyimide thin films (1 to several layers)/ceramic layers (1 to several layers)/polyimide thin films (1 to several layers) and high molecular sheets/ceramics/printed board/polyimide thin film can be laminated. In addition, a laminate formed by changing the material of sheet to be laminated for each layer can be used.

(Embodiment 6)

Figure 11A:
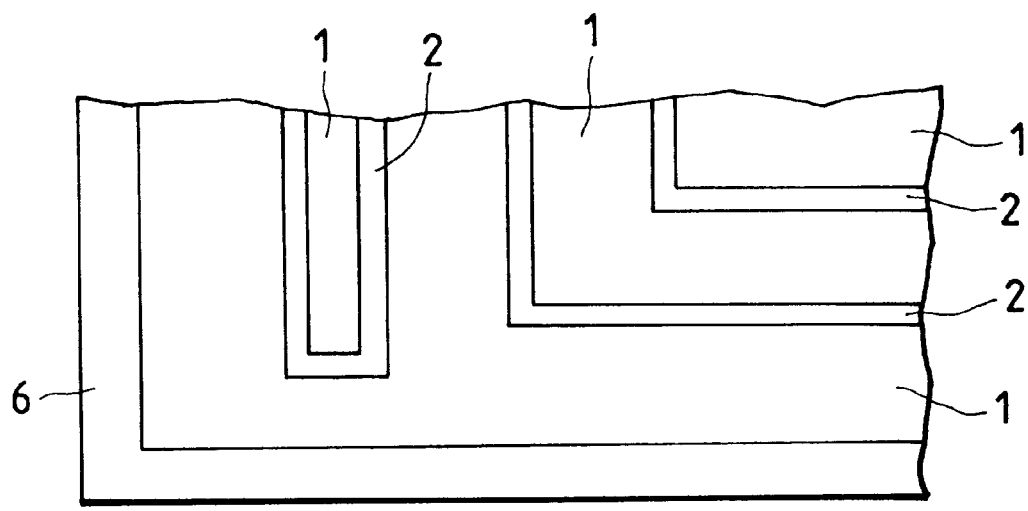
FIGS. 11(a) and 11(b) are illustration of portions of the embodiment in which the layers are shown to be connected by applying a bonding agent only to an external periphery.

In this embodiment, the bonding agent 6 is applied onto only the external periphery of the surface of the insulation film 1 where the wiring 2 is provided as shown in FIG. 11(a). In this embodiment, the multilayer substrate is obtained as in the embodiment 1 except that the bonding agent 6 is not applied to the whole surface where the wiring 2 is provided.

Figure 12A:
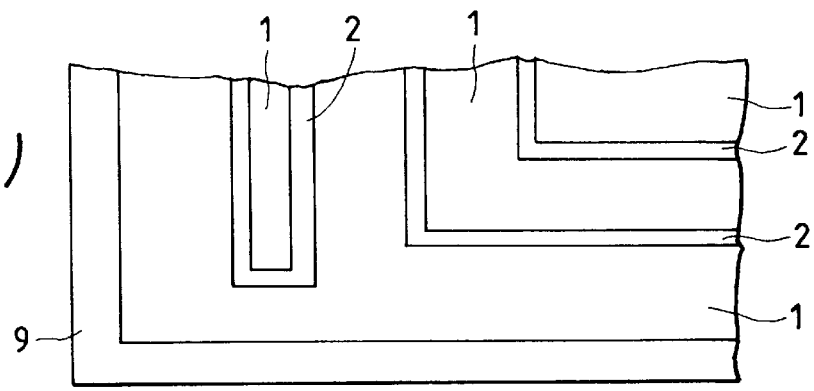
FIGS. 12(a)–12(c) are illustrations of portions of the embodiment in which the layers are shown to be connected by providing a frame pattern and a frame bonding member on the external periphery.
Figure 12B:
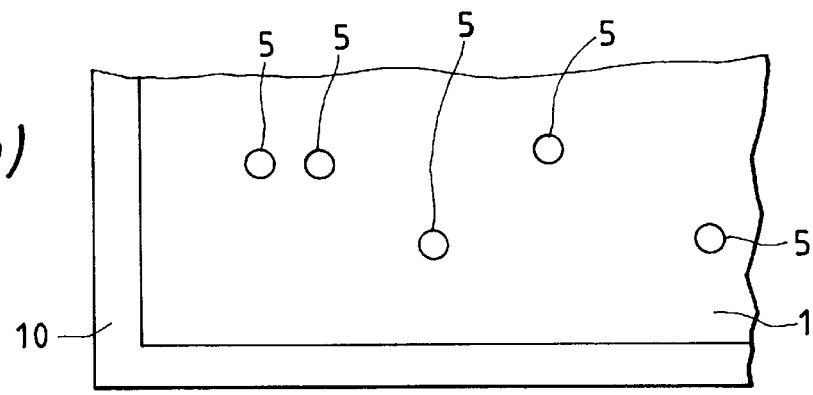

The multilayer substrate is obtained through inter-layer bonding implemented by forming a frame pattern 9 with the same metal as the wiring 2 on the external periphery as shown in FIG. 12(a) in a step for forming the wiring pattern 2 on the external periphery instead of applying or placing the bonding agent 6 onto the external periphery in the embodiment 1 and forming a frame type bonding member 10 on the external periphery as shown in FIG. 12(b) in a step for forming the bonding member to bond the frame type pattern and the frame type bonding member each other. FIG. 12(a) is an external view of the surface having the wiring 2 of the sheet 1 before lamination and FIG. 12(b) is an external view of the surface having the bonding member 5 of the sheet 1 before lamination. The positions and shapes of the wiring pattern 2 shown in FIG. 12(a) and the bonding member 5 shown in FIG. 12(c) are only the examples and can be determined as desired.

Figure 11B:
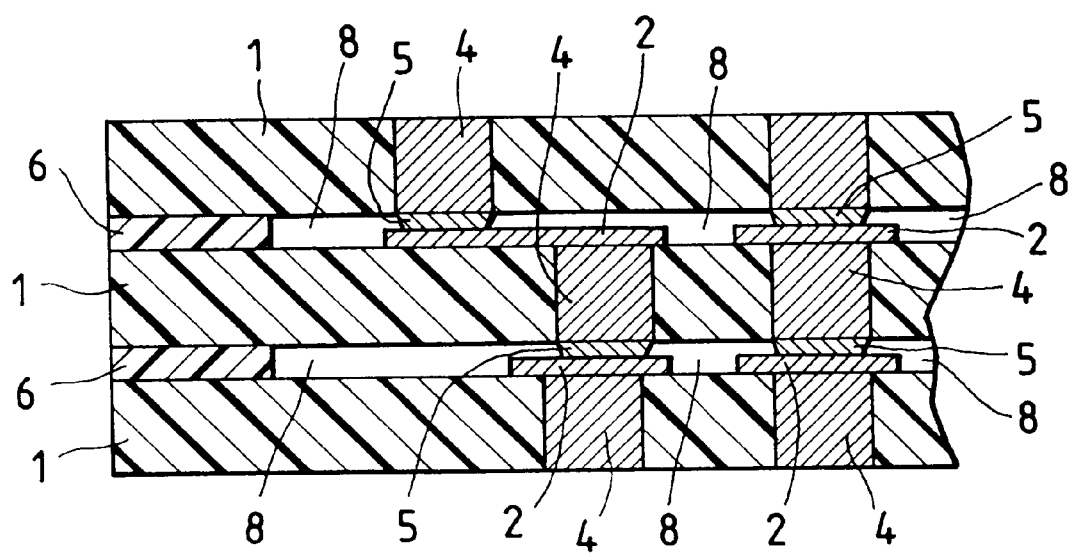
Figure 12C:
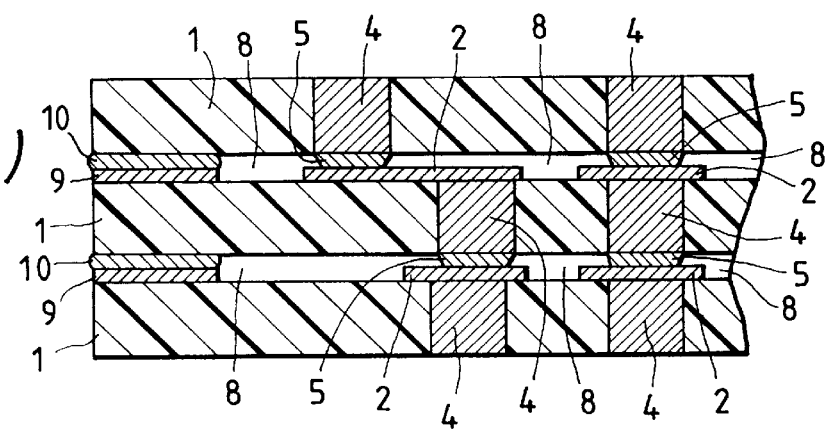

The multilayer substrate fabricated according to this embodiment has a clearance 8 between the laminated films 1 as shown in FIG. 11(b) and FIG. 12(c). The multilayer substrate thus obtained enables to implement high precision, fine and high density wiring and provide satisfactory electrical conduction between layers.

The clearance 8 may be made pressure-reduced by lamination and connection of substrates in a pressure-reduced atmosphere or an atmosphere of inert gas, nitrogen gas or dry air, or may be filled with an inert gas, nitrogen gas or dry air. In addition, the clearance 8 may be filled with a material of low dielectric constant such as a resin which differs from the bonding agent on the external periphery by carrying out lamination and connection in a material of low dielectric constant such as a resin which differs from the bonding agent on the external periphery or applying this material to a part other than the external periphery. The whole surface of the sheet 1 may be bonded by applying a bonding agent of low dielectric constant which differs from the bonding agent on the external periphery to a part other than the external periphery. For example, it can be considered to use a silicone-based bonding agent to the external periphery and a polyimide-based bonding agent to a part other than the periphery. Thus a satisfactory bonding effect and a desired dielectric constant can be simultaneously realized.

(Embodiment 7)

Figure 13:
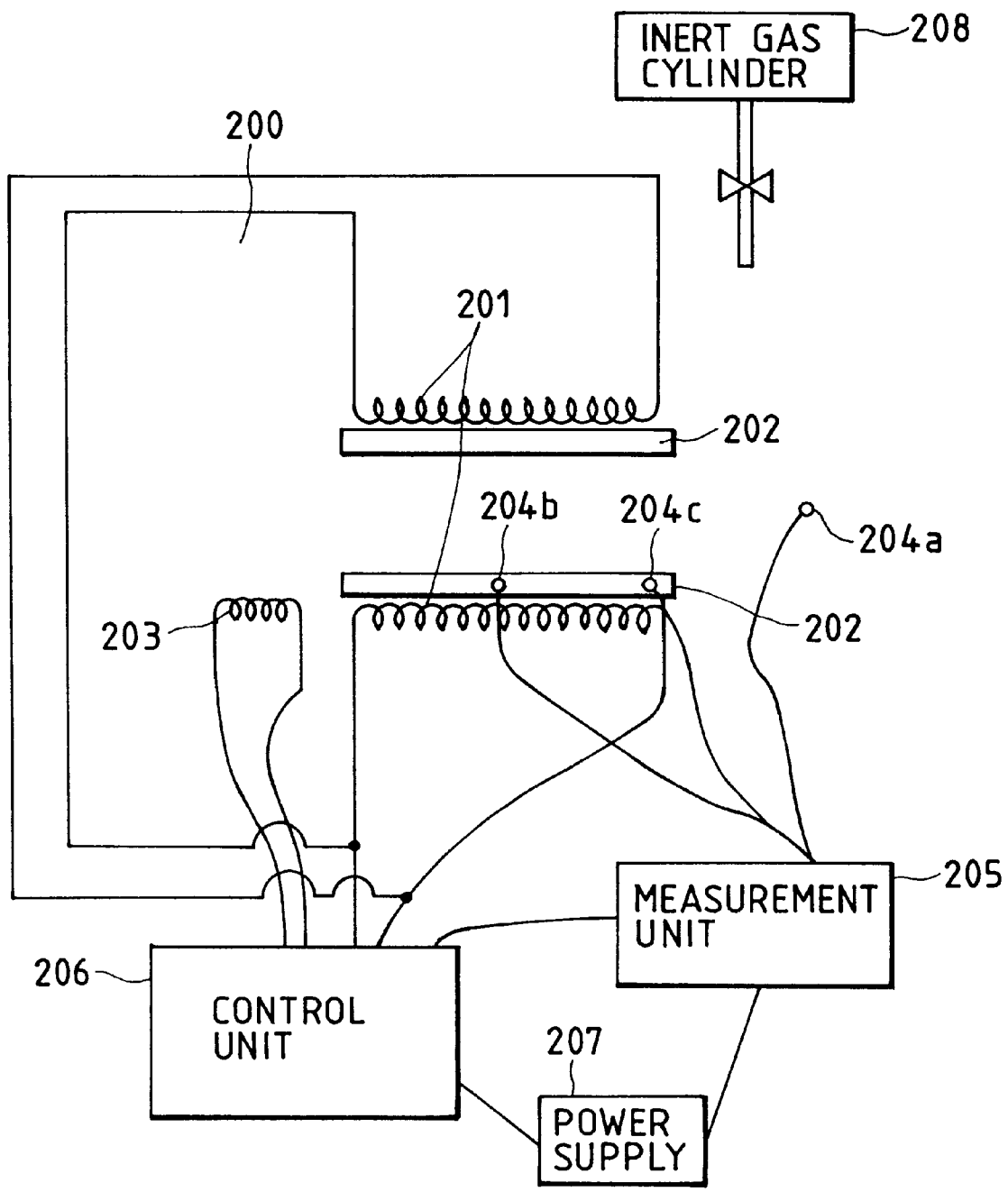
FIG. 13 is a schematic diagram showing a construction of a multilayer substrate fabrication apparatus according embodiment 7.

If a temperature difference in the laminates is large in simultaneous thermo-compression of laminated sheets, there is a possibility that some parts are connected and other parts are not connected. Therefore, in this embodiment, thermo-compression is conducted by using the equipment capable of maintaining the temperatures in the laminates at a fixed level. Other steps are carried out as in the embodiment 1. The construction of the multilayer substrate fabricating apparatus used in this embodiment is shown in FIG. 13.

The fabricating apparatus for the multilayer substrate according to this embodiment has a chamber 200 capable of maintaining the internal airtight condition. The chamber 200 is adapted to replace its internal atmosphere with an inert gas supplied from an inert gas cylinder 208 coupled to the chamber 200 and fill the chamber 200 with the inert gas atmosphere. The chamber 200 may be evacuated by reducing its internal pressure to a super high vacuum state instead of filling the chamber 200 with inert gas. Dry nitrogen gas, dry air or the like may be used instead of inert gas.

The chamber 200 is internally provided with upper and lower pressure applying plates 202 for holding the laminates therebetween and applying a pressure thereto, a pair of heaters 201 for heating these two pressure applying plates 202, a heater 203 for heating the atmosphere, a temperature sensor 204a which senses a temperature of the atmosphere as required, a temperature sensor 204b which senses a temperature of the central parts of the pressure applying plates 202 as required, and a temperature sensor 204c which senses a temperature of the external peripheries of the pressure applying plates 202 as required.

In addition, the chamber 200 is externally provided with a measurement unit 205 for measuring the temperature by the temperature sensors 204a, 204b and 204c, a control unit 206 for feedback-controlling a voltage of heaters 201 and 203 so that respective parts come to have a predetermined temperature, and a power supply 207.

In this embodiment, the laminates are heated not only by the pressure applying plates 202 heated by the heater 201 for the pressure applying plates but also by heating the whole atmosphere in the chamber 200 by using the heater 203. The laminate held by the pressure applying plates 202 heated by the heater 201 is subject to have concentration of heat at its central part and the temperature at the external periphery is lower than that at the central part.

In this embodiment, therefore, the temperatures of the external peripheries of the laminates are raised by heating the atmosphere in the chamber 200 with the heater 203. In this embodiment, the temperatures of the pressure applying plates 202 and the atmosphere which are heated by heaters 201 and 203 are measures by the temperature sensor 204 and the measurement unit 205, and the temperature difference in the laminates can be eliminated by feedback-controlling heating by heaters 201 and 203 through the voltage control unit 206 using the data obtained as a result of measurement. Thus, in this embodiment, all bonding points can be preferably connected.

The multilayer substrate fabricated according to embodiment enables to provide a high precision, and high density wiring and satisfactory electrical function between substrates.

As described above, the present invention enables to implement large reduction of fabrication cost and a high precision, fine and high density wiring by simultaneous lamination of multilayer substrates.

What is claimed is:

1. A multilayer substrate comprising a stacked arrangement of a plurality of wiring substrates each including:
   an insulation film;
   a plurality of via holes which are respectively provided to pass through from an upper surface to a lower surface of said insulation film;
   a wiring pattern including wirings which are provided on the upper surface of said insulation film and on the upper surfaces of each of said via holes and electrically connected to said via holes;
   bonding members which are respectively provided on the lower surfaces of each of said via holes of said insulation film and electrically connected to said via holes, wherein each bonding member covers the entirety of the lower surface of the via hole associated therewith; and a bonding layer which is separately formed from the bonding members and is provided on the upper surface of said insulation film where the wiring pattern is formed.

2. A multilayer substrate according to claim 1, wherein said insulation film is made of at least one of a polyimide-based insulation film, a ceramic-based insulation film, an epoxy-based insulation film, and a glass-based insulation film.

3. A multilayer substrate according to claim 1, wherein said insulation film is a sheet type insulation film.

4. A multilayer substrate according to claim 1, wherein said wiring is made of at least one of Cu, Al, W, Au, Pt, Ag, and an Ag—Pd alloy.

5. A multilayer substrate according to claim 1, wherein a melting point of said bonding member is lower than both a melting point of said wirings and a heat resisting temperature of said insulation film.

6. A multilayer substrate according to claim 1, wherein said bonding member is at least one of a brazing material and a soldering material.

7. A multilayer substrate according to claim 1, wherein said bonding member is at least one of Sn, Sn—Pb, Pb, Au, Ag, Zn, In, Sn—Ag.

8. A multilayer substrate according to claim 1, wherein a combination of said bonding member and said wiring is at least one of Sn/Cu, Sn—Pb/Cu, Pb/Cu, Au/Cu, Ag/Cu, Zn/Cu, In/Cu, Sn/Al, Au/Al, Ag/Al, and Sn—Ag/Al.

9. A multilayer substrate according to claim 1, wherein said bonding layer is formed with a hardened thermoplastic bonding agent.

10. A multilayer substrate according to claim 1, wherein said bonding layer is formed with a hardened thermosetting bonding agent.

11. A multilayer substrate according to claim 1, wherein said bonding layer is provided as a frame type layer on an external periphery of said insulation film.

12. A multilayer substrate according to claim 11, wherein an internal space of a frame of said bonding layer is filled with one of a dry gas and a resin.

13. A multilayer substrate according to claim 12, wherein said dry gas is dry air, dry nitrogen or an inert gas.

14. A multilayer substrate according to claim 11, wherein an internal space of said frame is provided with a pressure-reduced atmosphere.

15. A multilayer substrate comprising a stacked arrangement of a plurality of wiring substrates,
wherein each wiring substrate includes:
an insulation film;
a plurality of via holes which are respectively provided to pass through from an upper surface to a lower surface of said insulation film;
a wiring pattern including wirings which are provided on the upper surface of said insulation film and on the upper surfaces of each of said via holes and electrically connected to said via holes;
a frame-shaped pattern which is provided on an external periphery of the upper surface of said insulation film;
first bonding members which are provided on the lower surfaces of said via holes and electrically connected to said via holes, respectively, wherein each bonding member covers the entirety of the lower surface of the via hole associated therewith; and a second bonding member which is provided on the external periphery of the lower surface of said insulation film so as to be substantially symmetrical to said frame-shaped pattern with said insulation film provided therebetween, and
wherein a clearance between said wiring substrates is filled with one of a dry gas and a resin.

16. A multilayer substrate according claim 15, wherein said dry gas is dry air, dry nitrogen or inert gas.

17. An electronic device comprising an LSI, a multilayer substrate, power supply part and an external storage, said multilayer substrate comprising a plurality of wiring substrates which are laminated each including:
an insulation film;
a plurality of via holes which are respectively provided to pass through from an upper surface to a lower surface of said insulation film;
a wiring pattern including wirings which are provided on the upper surface of said insulation film and on the upper surfaces of each of said via holes and electrically connected to said via holes;
bonding members which are respectively provided on the lower surfaces of each of said via holes of said insulation film and electrically connected to said via holes; and
a bonding layer which is separately formed from the bonding members and is provided on a surface of said insulation film where the wiring pattern is formed.

18. An electronic device according to claim 17, wherein said insulation film is made of at least one of a polyimide-based insulation film, a ceramic-based insulation film, an epoxy-based insulation film, and a glass-based insulation film.

19. An electronic device according to claim 17, wherein said insulation film is a sheet type insulation film.

20. An electronic device according to claim 17, wherein said wirings are made of at least one of Cu, Al, W, Au, Pt, Ag, and an Ag—Pd alloy.

21. An electronic device according to claim 17, wherein a melting point of said bonding member is lower than both a melting point of said wirings and a heat resisting temperature of said insulation film.

22. An electronic device according to claim 17, wherein said bonding member is at least one of a brazing material and a soldering material.

23. An electronic device according to claim 17, wherein said bonding member is at least one of Sn, Sn—Pb, Pb, Au, Ag, Zn, In, Sn—Ag.

24. An electronic device according to claim 17, wherein a combination of said bonding member and said wiring is at least one of Sn/Cu, Sn—Pb/Cu, Pb/Cu, Au/Cu, Ag/Cu, Zn/Cu, In/Cu, Sn/Al, Au/Al, Ag/Al, and Sn—Ag/Al.

25. An electronic device according to claim 17, wherein said bonding layer is formed with a hardened thermoplastic bonding agent.

26. An electronic device according to claim 17, wherein said bonding layer is formed with a hardened thermosetting bonding agent.

27. A multilayer substate comprising a stacked arrangement of a plurality of wiring substrates,
wherein each wiring substrate includes:
an insulation film;
a plurality of via holes which are respectively provided to pass through from an upper surface to a lower surface of said insulation film;
a wiring pattern including wirings which are provided on the upper surface of said insulation film and on the upper surfaces of each of said via holes and electrically connected to said via holes;

a frame-shaped pattern which is provided on an external periphery of the upper surface of said insulation film;

first bonding members which are provided on the lower surfaces of said via holes and electrically connected to said via holes respectively, wherein each bonding member covers the entirety of the lower surface of the via hole associated therewith; and a second bonding member which is provided on the external periphery of the lower surface of said insulation film so as to be substantially symmetrical to said frame-shaped pattern with said insulation film provided therebetween, and wherein a clearance between said wiring substrate is maintained at a pressure-reduced state.

* * * * *